(12) United States Patent
Helle et al.

(10) Patent No.: US 8,468,681 B2
(45) Date of Patent: Jun. 25, 2013

(54) ESTABLISHING A WIND TURBINE GENERATOR WITH ONE OR MORE PERMANENT MAGNET (PM) ROTORS

(75) Inventors: Lars Helle, Suldrup (DK); Philip Richard Jacobsen Carne Kjaer, Arhus C (DK); Morten Lindholm, Hojbjerg (DK); Flemming Buus Bendixen, Hobro (DK); Ion Boldea, Timisoara (RO)

(73) Assignee: Vestas Wind Systems A/S, Aahrus N (DK)

( * ) Notice: Subject to any disclaimer, the term of this patent is extended or adjusted under 35 U.S.C. 154(b) by 547 days.

(21) Appl. No.: 12/565,577

(22) Filed: Sep. 23, 2009

(65) Prior Publication Data

US 2010/0011567 A1 Jan. 21, 2010

Related U.S. Application Data

(63) Continuation of application No. PCT/DK2008/000114, filed on Mar. 19, 2008.

(30) Foreign Application Priority Data

Mar. 23, 2007 (DK) .................................. 2007 00455

(51) Int. Cl.
*H02K 15/00* (2006.01)
*H02K 15/14* (2006.01)
*H02K 15/16* (2006.01)

(52) U.S. Cl.
USPC ................ 29/596; 29/592.1; 29/598; 29/606; 73/147; 310/45; 310/262

(58) Field of Classification Search
USPC ........... 29/592.1, 592, 596, 598, 606; 73/147; 310/42, 45, 217, 261, 262
See application file for complete search history.

(56) References Cited

U.S. PATENT DOCUMENTS

| 5,650,706 | A | 7/1997 | Yamada et al. | |
| 6,794,777 | B1 * | 9/2004 | Fradella | 310/74 |
| 7,646,178 | B1 * | 1/2010 | Fradella | 322/46 |

(Continued)

FOREIGN PATENT DOCUMENTS

| DK | 172430 B1 | 6/1998 |
| EP | 1458080 A1 | 9/2004 |
| JP | 2004173415 A | 6/2004 |
| WO | 9935729 A2 | 7/1999 |

OTHER PUBLICATIONS

Danish Search Report; PA 2007 00455; Sep. 13, 2007; 1 page.

(Continued)

*Primary Examiner* — Paul D Kim
(74) *Attorney, Agent, or Firm* — Patterson & Sheridan, LLP

(57) ABSTRACT

A method for establishing a wind turbine generator with one or more Permanent Magnet (PM) rotors. The method comprises the steps of: manufacturing a generator prepared for taking one or more PM rotors, manufacturing one or more rotors comprising a plurality of holding means prepared for retaining PM material, mounting substantially non-magnetized PM material prepared for magnetization in said holding means before or after said one or more rotors are mounted in said generator, connecting a magnetization system for magnetizing said PM material in the generator, and magnetizing said PM material with said magnetization system. The invention also relates to a wind turbine nacelle, a wind turbine comprising said wind turbine nacelle and use of a wind turbine.

13 Claims, 4 Drawing Sheets

U.S. PATENT DOCUMENTS

| | | | |
|---|---|---|---|
| 7,952,346 B2 * | 5/2011 | Helle et al. | 324/207.25 |
| 8,013,464 B2 * | 9/2011 | Stern et al. | 290/55 |
| 2003/0055584 A1 | 3/2003 | Raftari et al. | |
| 2003/0071467 A1 | 4/2003 | Calley et al. | |
| 2004/0041409 A1 | 3/2004 | Gabrys | |

OTHER PUBLICATIONS

International Search Report; PCT/DK2008/000114; Feb. 19, 2009; 3 pages.

* cited by examiner

ESTABLISHING A WIND TURBINE GENERATOR WITH ONE OR MORE PERMANENT MAGNET (PM) ROTORS

CROSS-REFERENCE TO RELATED APPLICATIONS

The present application is a continuation of pending International patent application PCT/DK2008/000114 filed on Mar. 19, 2008 which designates the United States and claims priority from Danish patent application PA 2007 00455 filed on Mar. 23, 2007, the content of which is incorporated herein by reference.

FIELD OF THE INVENTION

The invention relates to a method for establishing a wind turbine generator with one or more Permanent Magnet (PM) rotors, a wind turbine nacelle and wind turbine.

BACKGROUND OF THE INVENTION

Assembling a large scale wind turbine generator comprises the installation of a rotor in stator.

For a PM wind turbine generator of large scale, excessive magnetic forces will interact between magnets of the rotor and iron of the stator resulting in a complicated installation setup.

Disclosed in Danish patent DK 172430 is a method for assembling an electrical PM machine comprising a plurality of poles by first assembling said machine with a rotor established in the stator where said rotor is without mounted permanent magnets and secondly establishing said pre-magnetized permanent magnets in the rotor by mounting pre-magnetized permanent magnets in prepared slots comprised in the rotor.

A disadvantage by the described method is that at the installation extensive magnetic forces act between the magnets and other magnetic components of the electrical machine. This requires special precautions to be taken during installation comprising special tools for holding, lifting and handling the magnets, magnetic components and the forces that interact between them. Furthermore in the case of large scale machines, personel safety has to taken into account.

It is an object of the invention to provide technique without the above mentioned disadvantages and especially it is an object to provide technique that excludes the requirement of specialized tools specific for the transportation and installation of large magnetized magnets in a rotor.

SUMMARY OF THE INVENTION

The invention relates to a method for establishing a wind turbine generator with one or more Permanent Magnet (PM) rotors comprising the steps of:
  manufacturing a generator prepared for taking one or more PM rotors,
  manufacturing one or more rotors comprising a plurality of holding means prepared for retaining PM material,
  mounting substantially non-magnetized PM material prepared for magnetization in said holding means before or after said one or more rotors are mounted in said generator,
  connecting a magnetization system for magnetizing said PM material in the generator, and
  magnetizing said PM material with said magnetization system.

By magnetizing the PM material after it is mounted on the rotor of e.g. a large scale wind turbine generator it is ensured that problematic issues regarding transporting, handling and assembling magnetized magnets are minimized e.g. the requirement of special non-magnetic lifting, installation and positioning tools and equipment to withstand the large magnetic field from said magnets are reduced substantially to a need for equipment capable of lifting the substantially non-magnetized magnets.

Furthermore it is ensured that special precautions regarding personel safety and transport of magnetic material and special precautions for the existence of e.g. magnetic field sensitive components near said magnet and/or loose magnetic materials such as magnetic dust and small iron particles, is minimized.

It is furthermore ensured that mounting said non-magnetized PM material can be established with equipment that can be made of magnetic material.

Even further it is ensured that the PM material mounted in said holding means can be magnetized to a level at least equal to similar PM material that is magnetized in another location than when mounted in the holding means.

Further it is ensured that i.e. a correct positioning of the PM material on the rotor can be obtained resulting in e.g. a uniform air gap between the rotor and the stator of the generator. This in turn results in an improved performance such as a better balance of the rotor, a more uniform induction of the stator coils during operation etc.

In another aspect of the invention said mounting of substantially non-magnetized PM material and subsequent magnetization of PM material are performed when the wind turbine generator is installed in a wind turbine nacelle. Hereby it is ensured that said wind turbine generator can be installed in a non-magnetized condition and that no extra special designed tools are required as to withstand the excessive magnetic forces of magnetized PM material during installation. Furthermore it is ensured that the magnetization can be performed after the nacelle is assembled e.g. in a factory.

In another aspect of the invention said mounting of substantially non-magnetized PM material and subsequent magnetization of PM material are performed on the wind turbine generator before or after mounting the nacelle on a wind turbine tower. Hereby it is ensured that the magnetization can be performed on a suitable location and/or at a suitable time in the installation process of a wind turbine. Furthermore special precautions regarding transportation can be minimized. Even further it is ensured that the magnetization can be performed when magnetization means is available and operating.

In another aspect of the invention the magnetization of PM material is supplied by a magnetization system comprising magnetization coil means and at least one power supply. Hereby it is ensured that tools for magnetization are available. Furthermore it is ensured that it is possible to establish a magnetization system that is adapted as to supply correct and sufficient parameters of the magnetization process such as current, voltage, magnetic field, time control etc.

In another aspect of the invention the magnetization current to said magnetization coil means is supplied by at least one power converter or section of said power converter as power supply. By a power converter is here meant an existing power converter of the wind turbine used to supply the utility grid during normal operation. Hereby it is ensured that existing power converters of the wind turbine can be used as power supply in said magnetization system which in turn reduces the requirements and costs to special dedicated magnetization tools. For different embodiments said supply of magnetization current to said magnetization coil can be supplied before or after the wind turbine nacelle is installed on a wind turbine tower.

In another aspect of the invention said magnetization current to said magnetization coil means is supplied by one or more power converters dedicated to said magnetization of PM material. Hereby it is ensured that said dedicated power converters can supply correct and sufficient parameters of the magnetization process such as current, voltage, magnetic field, time control etc. Furthermore it is ensured for different embodiments that said dedicated power converter can be made mobile and can be used to magnetization on different wind turbines. Hereby a reduction of investment in specialized magnetization equipment can be reduced.

In another aspect of the invention said magnetization current to said magnetization coil means is supplied by at least one power converter of the wind turbine or section of said power converter of the wind turbine. By using the wind turbine power converter it is ensured that the converter is available when needed for magnetization purposes. Furthermore it is ensured that electrical connection between converter and magnetization coil may be established. Even further it is ensured that sections of the power converter can be combined as to establish an optimal and sufficient magnetization current.

In another aspect of the invention said connecting a magnetization system comprises connecting one or more magnetization coils that are designed for magnetization of PM material. Hereby it is ensured that an optimal level of magnetization can be obtained. Furthermore it is ensured that said coils can be special designed as to manage excessive parameters of the magnetization process such as current, voltage etc.

In another aspect of the invention said magnetization coils are integrated in the stator or are replacing one or more stator parts of the wind turbine generator during magnetization of PM material. Hereby it is ensured that the PM material can be magnetized when the one or more rotors are installed in the generator. Furthermore it is ensured that stator coils also used for normal operation can be used as magnetization coils during the magnetization process. Even further it is ensured that stator parts can be replaced by stator coils used for the magnetization only.

In another aspect of the invention said magnetization coils are dedicated for magnetization of PM material. Hereby it is ensured that the said magnetization stator coils can be designed as to sufficiently handle parameters of the magnetization such as current, voltage, magnetic field, magnetic forces. Furthermore it is ensured that magnetization can be managed substantially simultaneous to normal operation.

In a further aspect of the invention said connecting a magnetization system comprises establishing a solid retaining material in the air gap between the rotor permanent magnet and the magnetization coil during the magnetization of PM material. Hereby it is ensured that the PM material is retained in its position during magnetization even though extensive mechanical forces are acting on the material. It is furthermore ensured that also the magnetization coil is retained on position during said magnetization.

In another aspect of the invention said magnetizing of PM material comprises a continuous or stepwise rotation of said one or more permanent magnet rotors. Hereby it is ensured that said magnetization coils can be installed in a fixed position during the magnetization procedure whereby it in turn further can be ensured for different embodiments that only a minimum of time is needed for installing magnetizing equipment.

In another aspect of the invention said magnetizing said PM material with said magnetization system comprises measuring and controlling one or more parameters vital for the process such as voltage (V), current (A), time, temperature, position of rotor, level of magnetization etc. Hereby it is ensured that an optimal and desired level of magnetization can be obtained and further that said level can be monitored.

The invention also relates to a wind turbine nacelle and a wind turbine comprising said wind turbine nacelle.

BRIEF DESCRIPTION OF THE DRAWINGS

The invention will be described in the following with reference to the figures in which.

DETAILED DESCRIPTION OF THE INVENTION

Figure 1:
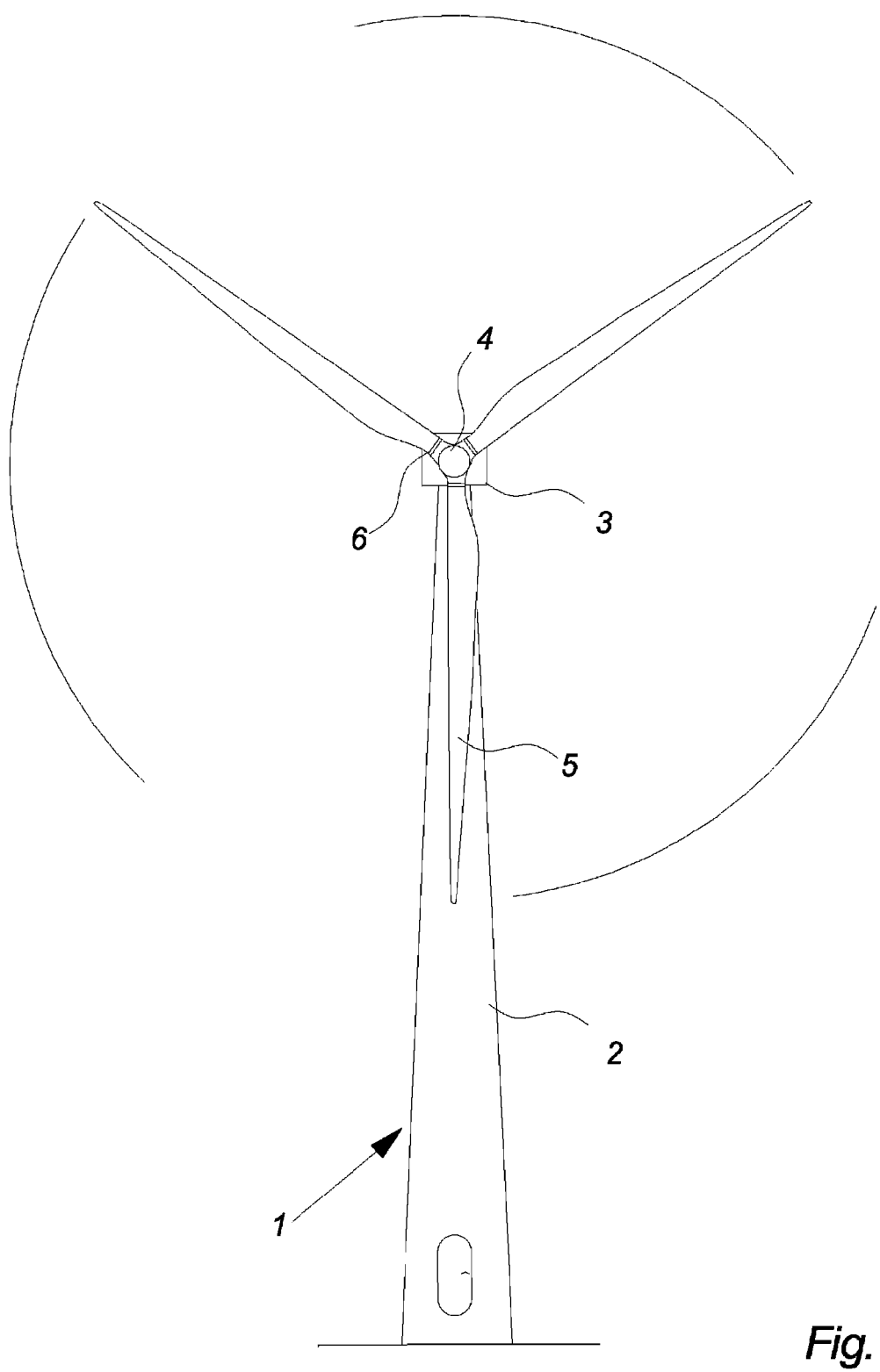
FIG. 1 illustrates a large modern wind turbine including three wind turbine blades in the wind turbine rotor.

FIG. 1 illustrates a modern wind turbine 1 with a tower 2 and a wind turbine nacelle 3 positioned on top of the tower.

The wind turbine rotor, comprising at least one blade such as three wind turbine blades 5 as illustrated, is connected to the hub 4 through pitch mechanisms 6. Each pitch mechanism includes a blade bearing and individual pitch actuating means which allows the blade to pitch. The pitch process is controlled by a pitch controller.

As indicated on the figure, wind over a certain level will activate the rotor and allow it to rotate in a substantially perpendicular direction to the wind. The rotation movement is converted to electric power by means comprising a generator and is usually supplied to the utility grid as will be known by skilled persons within the area.

In general the use of electrical generators in large wind turbines comprises use of one of at least two basic types of generators i.e. generators based on electromagnetic or permanent magnets respectively. The present invention relates to a generator comprising permanent magnets (PM).

PM generators comprises two components i.e. a rotating magnetic field constructed using permanent magnets and a stationary armature constructed using electrical windings located in a slotted iron core.

In magnetized condition said permanent magnets have a North-seeking pole and a South-seeking pole respectively. Opposite pole types attract, while poles of the same type repel each other. Furthermore poles of either type attract iron, steel and a few other metals such as nickel and cobalt.

Permanent magnets are made out of ferro- (or ferri-) magnetic material such as NdFeB, SiFe SrFeO or the like. During the formation of the magnetic material, very small atomic groups called magnetic domains act as one magnetic unit and produces a magnetic moment. The same domains align themselves in the same direction over a small volume. In non-magnetized condition the plurality domains of said permanent magnet are organized in a non-aligned way whereby the in a larger scale are substantially cancelling out each other resulting in no or a weak overall magnetic field.

By magnetizing a ferromagnetic permanent magnet e.g. by placing it in an external magnetic field such as produced in a solenoid with a direct current passing through it, all domains tend to align with the external magnetic field. Some domains align more easily than others so the resulting magnetic moment depends how strong the applied magnetic fields is, increasing until all possible domains are aligned.

If a ferromagnetic material is exposed for temperatures above its specific Curie temperature it loses its characteristic magnetic ability as thermal fluctuations destroy the alignment of said domains.

Usually permanent magnets are substantially not magnetic when they are produced but must be magnetized later on, e.g. on the location of production, just before they are assembled or after they as components are built into e.g. generators.

Figure 2:
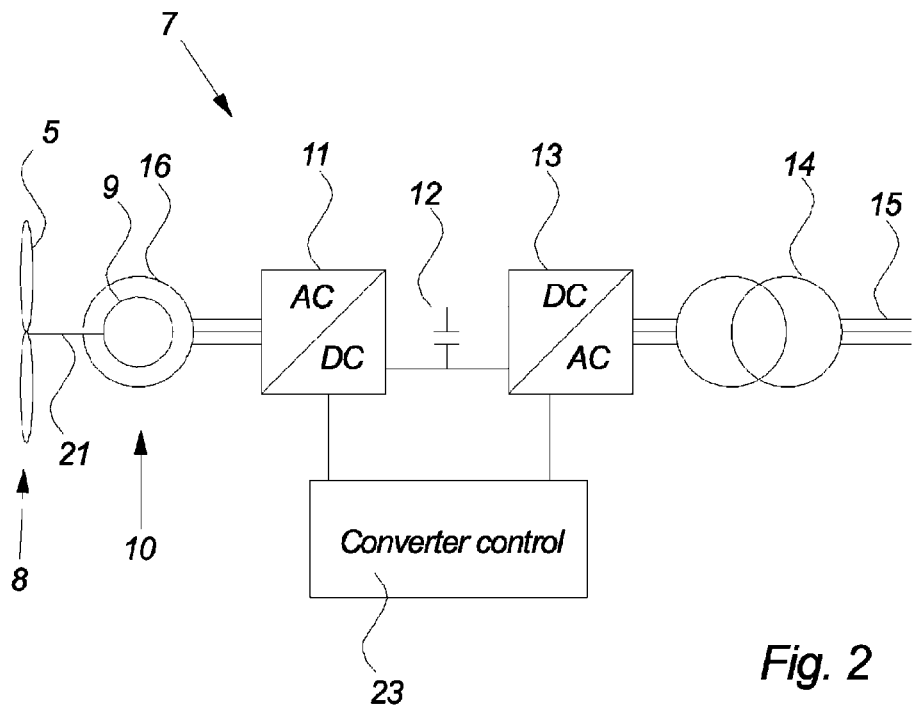
FIG. 2 illustrates schematically the components of one embodiment of a direct driven synchronous wind turbine.

FIG. 2 illustrates schematically the components of one embodiment of the present invention a direct driven pitch controlled variable speed synchronous generator wind turbine 7 comprising a wind turbine rotor 8 comprising wind turbine blades 5 substantially directly connected without a gear via a rotor shaft 21 to the rotating rotor 9 of a large multi pole generator 10 comprising permanent magnets, the stator 16 connected to a generator side AC/DC converter 11 for converting generated AC to a DC-link 12, a grid side DC/AC converter 13 and a transformer 14 for transformation to required grid voltage of the utility grid 15.

A converter control system 23 is connected to said converters 11, 13 in order to control their performance.

In various embodiments the invention relates to gear-less wind turbines operating synchronous with generator speed in the range of e.g. 5 to 25 rpm.

In other embodiments the invention relates to large scale wind turbines with one or more gear stages operating synchronous with generator speed in the range of e.g. 15 to 3000 rpm.

For different embodiments said large multi pole generator 10 can be of at least 3 different principal generator types i.e. an axial-flux generator 18, radial-flux generator 17 and transverse-flux generator. The basic difference between said generator types is the way the generated magnetic flux in the stator coils 19 are oriented relative to the rotor axis or rotor shaft 21 of the wind turbine.

Figures 3A, 3B:
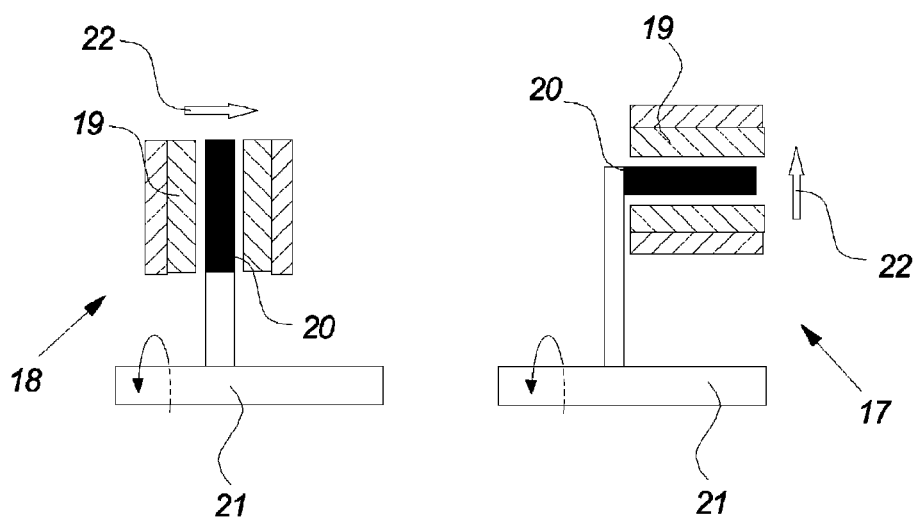
FIG. 3a illustrates schematically the principle construction of an axial-flux generator.
FIG. 3b illustrates schematically the principle construction of an radial-flux generator.

FIG. 3a and FIG. 3b illustrates schematically the principle construction of an axial-flux 18 and a radial-flux 17 generator respectively. Both types of generators comprise stator coils 19 and permanent magnets 20 connected to a rotating rotor shaft 21. Arrows 22 indicates the direction of the magnet flux.

Figure 4A:
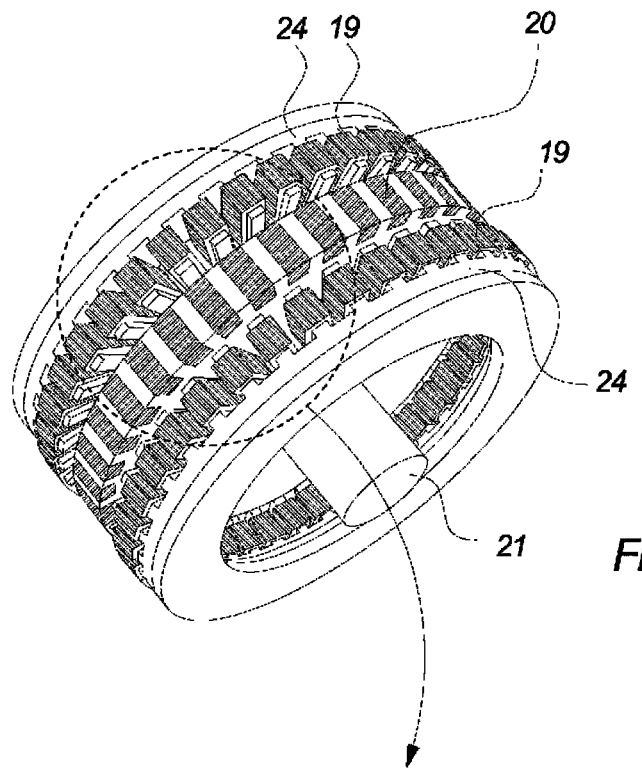
FIG. 4a illustrates an axial-flux generator.

One embodiment of a large multipole generator is illustrated in FIG. 4a comprising permanent magnets 20 connected to a rotor shaft 21 rotating between two rows of stator coils 19 with iron yokes 24.

Figure 4B:
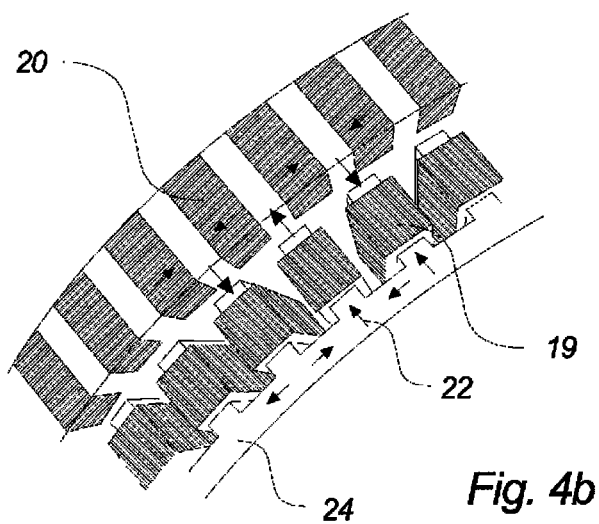
FIG. 4b illustrates a momentary flow of magnetic flux in an axial-flux generator.

FIG. 4b illustrates in an explored view, a momentary flow of magnetic flux in this embodiment. Arrows 22 indicates the directions.

For different embodiments of the invention, a generator can comprise more than one generator sections, each section principle constructed e.g. as FIG. 3a and/or FIG. 3b i.e. with a rotor comprising PM material and a number of stator sections.

The assembly of a large generator with pre-magnetized magnets requires large mechanical forces as to withstand excessive magnetic forces produced between generator components.

The present invention comprises installation of said permanent magnets 20, or PM material, in the rotor 9 of a large scale wind turbine in a substantially non-magnetized condition. Magnetization of the permanent magnets 20 is done when they are installed in the rotor 9. The installation may be done by use of special designed tools.

For different embodiments of the invention the design of the large generator 10 comprises design of special holding means for mounting said PM material 20 on the rotor 9. The holding means must be designed as to give an optimal and easy access for mounting the PM material 20 and furthermore ensure that the magnets 20 are retained in a desired and correct position during magnetization and during operation. For various embodiments of the invention the design can comprise special shaped PM materials 20 as well as special shaped retainers 26 and/or holding means.

Figure 5A:
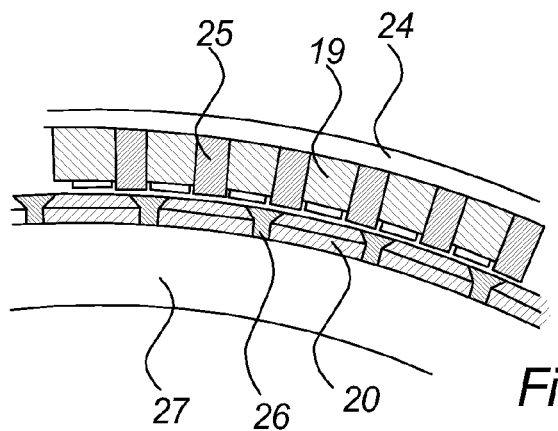
FIG. 5a illustrates parts of a side cross-view of a large generator according to one embodiment of the invention.

FIG. 5a illustrates parts of a side cross-view of a large generator 10 according to one embodiment of the invention, comprising stator coils 19 with iron yoke material 24, stator isolators 25 between stator coils 19, rotor permanent magnets 20 and magnet retainers 26 for fastening said magnets to the rotor base 27. For this embodiment the shapes of permanent magnets 20 and the retainers 26 are adapted as to fit each other, in order to ensure an optimal fastening to the rotor base 27.

For various embodiments of the present invention, the retainers 26 can be fixed parts of the rotor base 27, separate parts but fixed mounted on the rotor base 27 or separate parts detachable from the rotor base 27 and can be made of magnetic or non-magnetic material depending on the specific embodiment. Furthermore for embodiments of the present invention, said rotor permanent magnets 20 are held in position by holding means such as adhesive, screws, bolts, clamps, clips or the like.

For other embodiments of the invention said magnets are covered by a holding layer for fastening said magnets to the rotor base 27. Said holding layer can be of magnetic or non-magnetic material.

According to different embodiments of the present invention, the substantially non-magnetized rotor permanent magnets 20 can be mounted in said holding means before or after the rotor 9 is mounted in the generator.

Magnetizing the PM materials 20 comprises placing the material in an external magnetic field e.g. produced by a solenoid with a direct current passing through it. When the field is removed, the PM material 20 retains some of the magnetism with a magnetic pole orientation defined by the applied magnetic field.

For embodiments of the invention said solenoid can be one or more magnetization coils designed for magnetization operation.

For various embodiments of the invention the stator coils 19 and/or the magnetizing coils 31 can be super conducting coils.

For one embodiment of the invention where the rotor 9 is mounted in the large generator and permanent magnets 20 are installed in the holding means of the rotor 9, magnetization of the magnets 20 can be done by stator coils 19.

Figure 5B:
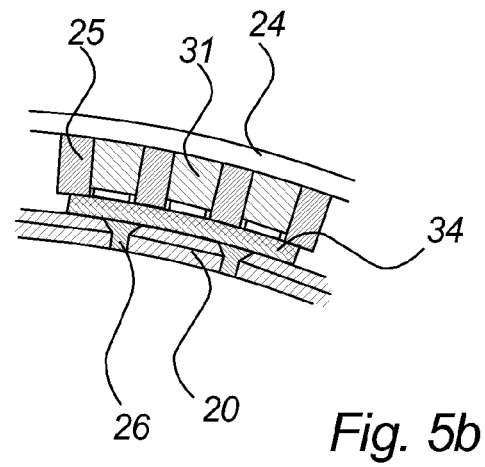
FIG. 5b illustrates retaining material established in the air gap according to various embodiments of the invention.

FIG. 5b illustrates for various embodiments of the invention a substantially non magnetic solid retaining material 34 is established in the air gap between the rotor permanent magnet 20 and the magnetization coil 31 in order to support the permanent magnet for retaining in position during the magnetization procedure, as extensive forces act on the magnets.

In one embodiment the magnetization coils 31 are pressed against the permanent magnets 20 during said magnetization procedure.

Figure 6:
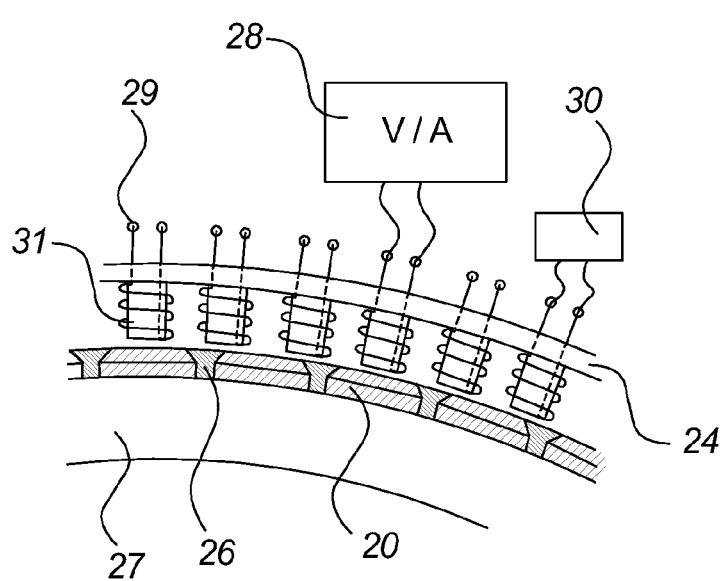
FIG. 6 illustrates schematically stator coils of a cross-section of the invention.

FIG. 6 illustrates schematically the functional concept of magnetizing a rotor for one embodiment of the invention, comprising magnetizing coils 31, rotor permanent magnets 20 and magnet retainers 26 for fastening said magnets to the rotor base 27. For this embodiment of the invention, the shape of permanent magnets 20 and their retainers 26 are adapted as to fit each other, in order to ensure an optimal fastening to the rotor base 27.

A magnetization controller 28 is used during the magnetization process in order to control one or more parameters vital for the process such as voltage (V), current (A), time, temperature, position of rotor 9, level of magnetization, magnetic field etc.

As illustrated in FIG. 6 the magnetization controller 28 is electrically connected to terminals 29 of one or more magnetizing coils 31.

During the magnetization procedure terminals 29 of coils not connected to said magnetization controller 28 can be connected to a proper termination 30 or can be left non-terminated.

For different embodiments of the invention, the one or more magnetization coils 31 used for magnetization are the stator coils 19 also used during normal operation or special purpose magnetization coils 31 used only during magnetization.

Furthermore said special purpose magnetization coils 31 can be part of the stator construction during normal operation or can be temporary mounted in close proximity to the PM material 20 during the magnetization procedure only e.g. by replacing one or more sections of normal operation stator coils 19 by one or more sections of special purpose magnetization coils 31.

For one embodiment of the invention during a magnetization procedure, the position of the rotor 9 is controlled in such a way that it is rotated in order to place the rotor permanent magnets 20 intended to be magnetized on a desired position relative to the said magnetization coils 31.

For another embodiment of the invention during a magnetization procedure, the rotor 9 is kept at a fixed position and the positioning of said magnetization coils 31 are altered as to be positioned on a desired position relative to the rotor permanent magnets 20 intended to be magnetized.

For yet another embodiment both the rotor 9 and the magnetization coils 31 are altered during a magnetization procedure.

For all embodiments the generator comprising rotor- and stator construction and supporting structures is designed as to handle the excessive mechanical forces produced during magnetization and during operation.

The level to which the permanent magnets 20 are magnetized during the magnetization procedure is controlled by said magnetization controller 28 and can be chosen dependent on parameters such as stability, degeneration of magnetic field over time, magnetization current, magnetization voltage etc.

For one embodiment of the invention the magnetization current needed by magnetization coils 31 for the magnetization is supplied by at least one power converter 11, 13 or section or combined sections of said power converter.

For another embodiment of the invention the magnetization current needed by magnetization coils 31 for the magnetization is supplied by one or more power converters dedicated to said magnetization.

For various embodiments of the invention said power converters supplying current to the magnetization coils 31 can be either power converters 11, 13 of the wind turbine or converters common to more than one wind turbine such as transportable power converters dedicated magnetization purposes.

What is claimed is:

1. A method for establishing a wind turbine generator with one or more Permanent Magnet (PM) rotors, the method comprising:
   manufacturing a generator prepared for taking the one or more PM rotors;
   manufacturing the one or more PM rotors comprising a plurality of holding elements configured to retain PM material;
   mounting substantially non-magnetized PM material prepared for magnetization in said plurality of holding element before or after said one or more rotors are mounted in said generator;
   connecting a magnetization system for magnetizing said non-magnetized PM material in the generator; and
   magnetizing said non-magnetized PM material with said magnetization system.

2. The method according to claim 1, wherein said mounting of substantially non-magnetized PM material and subsequent magnetization of said non-magnetized PM material are performed when the wind turbine generator is installed in a wind turbine nacelle.

3. The method according to claim 1, wherein said mounting of substantially non-magnetized PM material and subsequent magnetization of said non-magnetized PM material are performed on the wind turbine generator before or after mounting a nacelle on a wind turbine tower.

4. The method according to claim 1, wherein the magnetization of said non-magnetized PM material is supplied by the magnetization system comprising a magnetization coil element and at least one power supply.

5. The method according to claim 4, wherein magnetization current to said magnetization coil element is supplied by at least one power converter or section of said at least one power converter as the at least one power supply.

6. The method according to claim 5, wherein said magnetization current to said magnetization coil element is supplied the at least one power converters dedicated to said magnetization of said non-magnetized PM material.

7. The method according to claim 5, wherein said magnetization current to said magnetization coil element is supplied by the at least one power converter of the wind turbine generator or section of said at least one power converter of the wind turbine generator.

8. The method according to claim 1, wherein said connecting the magnetization system comprises connecting one or more magnetization coils that are designed for the magnetization of said non-magnetized PM material.

9. The method according to claim 8, wherein said one or more magnetization coils are integrated in a stator or are replacing one or more stator parts of the wind turbine generator during the magnetization of said non-magnetized PM material.

10. The method according to claim 8, wherein said one or more magnetization coils are dedicated for the magnetization of said non-magnetized PM material.

11. The method according to claim 8, wherein said connecting the magnetization system comprises establishing a solid retaining material in an air gap between the rotor permanent magnet and the one or more magnetization coils during the magnetization of said non-magnetized PM material.

12. The method according to claim 1, wherein said magnetizing of said non-magnetized PM material comprises a continuous or stepwise rotation of said one or more permanent magnet rotors.

13. The method according to claim 1, wherein said magnetizing said non-magnetized PM material with said magnetization system comprises measuring and controlling one or more parameters vital for the process, the are selected from the group consisting of vitals comprising at least one of: voltage (V), current (A), time, temperature, position of rotor, and level of magnetization.

* * * * *